(12) United States Patent
Buissette et al.

(10) Patent No.: US 10,450,200 B2
(45) Date of Patent: Oct. 22, 2019

(54) TUNGSTEN OXIDE-TYPE COMPOUND HAVING A NEW CRYSTALLINE STRUCTURE AND METHOD FOR PREPARING SAME

(71) Applicants: RHODIA OPERATIONS, Paris (FR); CENTRE NATIONAL DE LA RECHERCHE SCIENTIFIQUE, Paris (FR); UNIVERSITE PIERRE ET MARIE CURIE, Paris (FR)

(72) Inventors: Valerie Buissette, Paris (FR); Thierry Le Mercier, Rosny sous Bois (FR); Julie Besnardiere, Paris (FR); Sophie Cassaignon, Antony (FR); David Portehault, Le Kremlin-Bicetre (FR); Gilles Wallez, Issy-les-Moulineaux (FR)

(73) Assignees: RHODIA OPERATIONS, Paris (FR); CENTRE NATIONAL DE LA RECHERCHE SCIENTIFIQUE, Paris (FR); SORBONNE UNIVERSITE, Paris (FR)

( * ) Notice: Subject to any disclaimer, the term of this patent is extended or adjusted under 35 U.S.C. 154(b) by 0 days.

(21) Appl. No.: 15/031,353

(22) PCT Filed: Oct. 21, 2014

(86) PCT No.: PCT/EP2014/072523
§ 371 (c)(1),
(2) Date: Apr. 22, 2016

(87) PCT Pub. No.: WO2015/059127
PCT Pub. Date: Apr. 30, 2015

(65) Prior Publication Data
US 2016/0264430 A1 Sep. 15, 2016

(30) Foreign Application Priority Data

Oct. 22, 2013 (FR) .................................... 13 02438

(51) Int. Cl.
*C01G 41/02* (2006.01)
*C01G 41/00* (2006.01)
(Continued)

(52) U.S. Cl.
CPC ............. *C01G 41/02* (2013.01); *C01G 41/00* (2013.01); *C01G 41/006* (2013.01); *C30B 7/12* (2013.01);
(Continued)

(58) Field of Classification Search
CPC ...... C01G 41/02; C01G 41/00; C01G 41/006; C30B 29/22; C30B 7/14; C30B 7/12
See application file for complete search history.

(56) References Cited

U.S. PATENT DOCUMENTS

2006/0249461 A1* 11/2006 Luca ......................... G21F 9/12
210/688

FOREIGN PATENT DOCUMENTS

WO 02/096559 A1 12/2002

OTHER PUBLICATIONS

Genin, C., et al—"Hydrogen bronzes of new oxides of the WO3—MoO3 system with hexagonal, pyrochlore and ReO3-type structures", 1992, Solid State Ionics, North Holland Pub. Co., vol. 53-56, pp. 315-323.

(Continued)

*Primary Examiner* — James A Fiorito

(57) ABSTRACT

The compound according to the invention is a compound of formula (1) $A_x W_{1-y} M_y O_3$, wherein A is chosen from the group comprising the Li, Na, $NH_4$, K and H cations, and it is characterized in that x and y verify the relationships (Continued)

Figure 1:
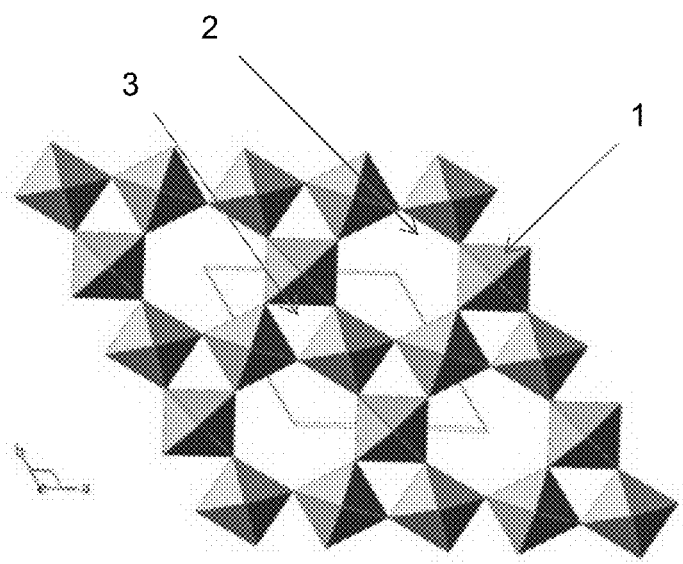

$0 \leq x \leq 1$ and $0 \leq y \leq 0.5$, and in that it has a crystalline structure of the hexagonal type with a base of $WO_6$ octahedra, said structure having tunnels delimited by 6, 4 and 3 of said octahedra and oriented along the axis c.

18 Claims, 3 Drawing Sheets

(51) Int. Cl.
    *C30B 7/12*     (2006.01)
    *C30B 7/14*     (2006.01)
    *C30B 29/22*     (2006.01)

(52) U.S. Cl.
    CPC ................ *C30B 7/14* (2013.01); *C30B 29/22* (2013.01); *C01P 2002/60* (2013.01); *C01P 2004/20* (2013.01); *C01P 2004/24* (2013.01); *C01P 2004/61* (2013.01); *C01P 2004/62* (2013.01); *C01P 2004/64* (2013.01)

(56) References Cited

OTHER PUBLICATIONS

Zhan, J., et al—"A solvothermal route for the synthesis of ammonium tungsten bronze", 1999, Solid State Ionics, vol. 126, Issue Nos. 3-4, pp. 373-377.

\* cited by examiner

TUNGSTEN OXIDE-TYPE COMPOUND HAVING A NEW CRYSTALLINE STRUCTURE AND METHOD FOR PREPARING SAME

CROSS-REFERENCE TO RELATED APPLICATIONS

The present application is a U.S. national phase entry under 35 U.S.C. 071 of International Application No. PCT/EP2014/072523, filed on Oct. 21, 2014, which claims the priority of French application FR 13 02438 filed at the INPI (French National Industrial Property Institute) on Oct. 22, 2013. The entire contents of these prior applications are explicitly incorporated herein by this reference. In case of inconsistency between the present application and the prior French application affecting the clarity of a term, reference is made exclusively to the present application.

The present application claims the priority of the prior French application FR 13 02438 filed at the INPI (French National Industrial Property Institute) on Oct. 22, 2013, the content of which is incorporated entirely with reference to the present application. In case of inconsistency between the present application and the prior French application affecting the clarity of a term, reference is made exclusively to the present application.

The present invention relates to a tungsten oxide-type compound having a new crystalline structure and also to the process for preparing same.

Tungsten oxides have been widely described in the literature, in the form of crystalline or non-crystalline, stoichiometric or sub-stoichiometric $WO_3$ compounds. Tungsten oxides are of use in many technical applications such as electrochromic devices, supercondensers, batteries or even photocatalysts in the visible range.

For these applications, it is considered important for the structure of these oxides to be able to have spaces between the constituent atoms of the oxide, optionally allowing an insertion, within this structure, of cations such as in particular lithium or sodium.

For example, WO 02/096559 describes compositions of metal oxide having the empirical formula: $A_{x/n}[B_yM_{1-y}O_{3+\delta}]^xZH_2O$, wherein M represents at least one metal of the group Vb or VIb; A represents a cation selected from the group consisting of alkali metals, alkaline-earth metals, silver, ammonium, hydrogen and mixtures thereof; B represents at least one element selected from the group consisting of W, Zr, Mo, V, Ti, Fe, Ce, Sb, Nb, Mn, Co, Cr, Fe, Ta, Sn and Cu, on the condition that M and B are different; y is a number between 0 and 3; and 3+δ indicates the stoichiometry of the oxygen, these compositions serving to at least partially remove cations of at least one metal selected from the group consisting of cesium, strontium, lead, silver, transition metals, lanthanides and actinides, present in a liquid.

The object of the invention is to provide a compound of which the structure exhibits spaces that are even more accessible than those present in the structure of known tungsten oxides.

With this aim, the compound of the invention is a compound of formula (1) $A_xW_{1-y}Mo_yO_3$ wherein A is selected from the group consisting of the Li, Na, $NH_4$, K and H cations, and it is characterized in that x and y confirm the relationships $0 \leq x \leq 1$ and $0 \leq y \leq 0.5$ and in that it has a crystalline structure of hexagonal type which is based on $WO_6$ octahedra, said structure having tunnels delimited by 6, 4 and 3 of said octahedra and oriented along the axis c.

J. Zhan et al., Solid State Ionics, 126 (1999), 373-373 and Genin et al., Solid State Ionics, 53-56 (1992), 315-323 describe bronzes of hexagonal tungsten. The presence of the tunnels delimited by 6, 4 and 3 $WO_6$ octahedra and oriented along the axis c in the crystalline structure of the bronzes is not described.

Figure 2:
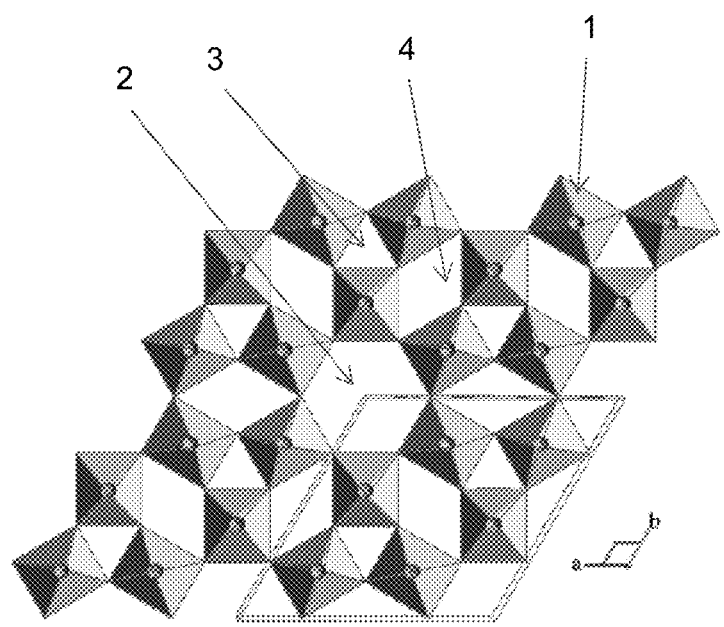
Figure 3:
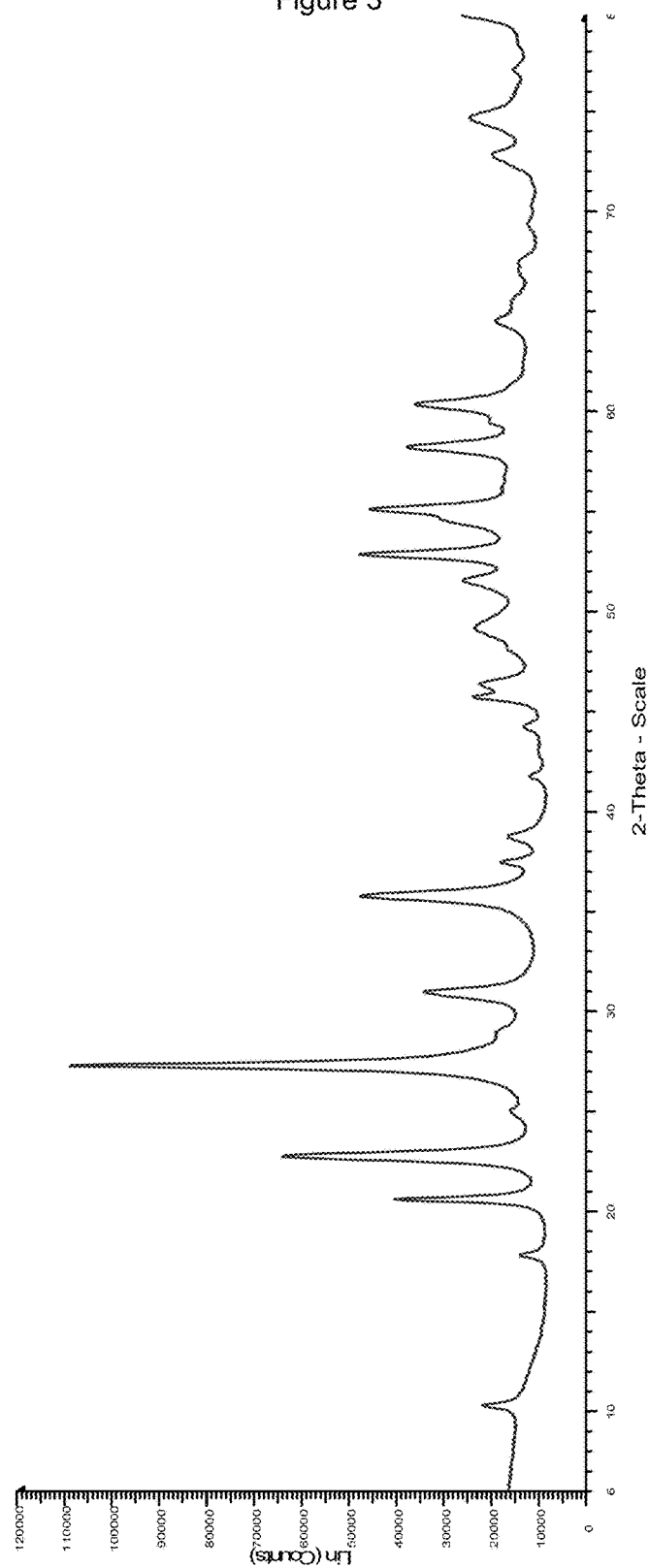
Figure 4:
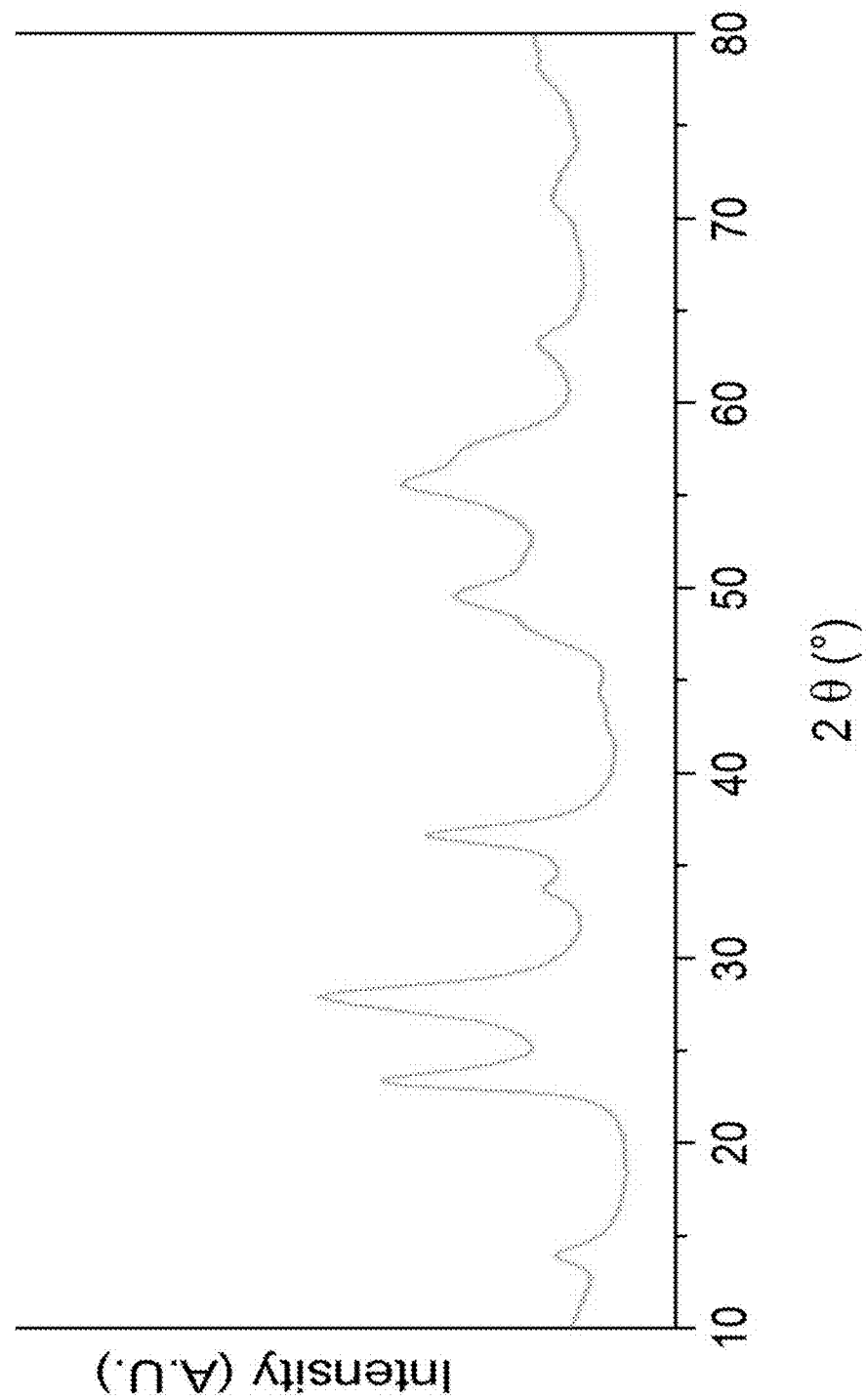

Other features, details and advantages of the invention will become even more fully apparent on reading the description which follows, given with reference to the attached drawings, in which:

la FIG. 1 is a diagram illustrating the crystalline structure of a product according to the prior art;

la FIG. 2 is a diagram illustrating the crystalline structure of a product according to the invention;

la FIG. 3 is an X-ray diagram of a product according to the invention;

la FIG. 4 is an X-ray diagram of a comparative product.

As indicated above, the compound of the invention has the chemical formula (1) $A_xW_{1-y}Mo_yO_3$. This formula should be interpreted as also covering compounds which are slightly sub-stoichiometric with respect to oxygen.

In this formula, A is selected from the Li, Na, $NH_4$, K and H cations. A may be more particularly Na or Li.

Moreover, x and y confirm the relationships $0 \leq x \leq 1$ and $0 \leq y \leq 0.5$. The compounds of formula (1) for which y is not zero correspond to products in which molybdenum substitutes for the tungsten.

According to particular embodiments, x can confirm the following relationships $0 \leq x \leq 0.2$ and $0.5 \leq x \leq 1$ and in the case where x confirms the latter relationship, A may be more particularly Na or Li.

According to three other particular embodiments, x is equal to 0, y is equal to 0 and x and y are both equal to 0, respectively.

The values of x and y are measured by the X-ray photoelectron spectroscopy technique in the case where A=H, $NH_4$ or Li, and by the energy dispersive X-ray analysis technique in the other cases.

Generally, the compound of the invention has a crystalline structure with lattice parameters a: 10.0(1) Å and c: 3.9(1) Å and space group P6/mmm. The structure contains 6 $WO_3$ units per lattice.

In the particular case where x=0.2 and A=H, the compound has a crystalline structure with lattice parameters a: 9.9973 Å and c: 3.9205 Å and space group P6/mmm.

For the whole of the description, the crystallographic characteristics were obtained by X-ray analysis with a copper anticathode.

The crystalline structure of $WO_3$ (all structures included, i.e. those which are known and that of the invention) is based on $WO_6$ octahedra linked to one another via the vertices. The conventional hexagonal structure in particular has tunnels comprising 3 and 6 octahedra (FIG. 1). The crystalline structure of the compound of the invention is based on $WO_6$ octahedra which are assembled so as to form tunnels of 3, 4 and 6 octahedra (FIG. 2). FIGS. 1 and 2 show these hexagonal structures consisting of arrangements of $WO_6$ octahedra (1).

According to a novel characteristic of the compounds of the invention, the structure exhibits an assembly of three types of tunnels, i.e. tunnels delimited respectively by 6, 4 and 3 $WO_6$ octahedra. The presence of these three types of tunnels appears in FIG. 2 which shows the tunnels (2), (3) and (4) which are delimited respectively by 6, 3 and 4 octahedra.

FIG. 1 reveals only tunnels (2) and (3) delimited by 6 or 3 octahedra only.

The novel structure has the effect of adding tunnels comprising 4 octahedra (4), while preserving the tunnels comprising 3 and 6 octahedra. By way of example, the diameter of the tunnels comprising 6 octahedra is 2.6(1) Å, this value being calculated by taking into account the size of the oxygen anions.

According to another characteristic of the product of the invention, said product is composed of particles in the shape of platelets of from 50 to 500 nm and more particularly from 50 to 100 nm in diameter, and from 2 to 50 nm and more particularly from 5 to 10 nm thick. This shape and the sizes of the particles can be demonstrated by transmission electron microscopy (TEM).

It should also be noted that the tunnels, oriented along the axis c, are located in the thickness of the platelets (perpendicular to the basal face of the particles).

The compound has a specific surface area of between 10 and 200 m$^2$/g, more particularly of at least 50 m$^2$/g and which may, for example, be 55 m$^2$/g.

The term "specific surface area" is intended to mean the BET specific surface area determined by nitrogen adsorption in accordance with the standard ASTM D 3663-78 drawn up from the Brunauer-Emmett-Teller method described in the periodical "The Journal of the American Chemical Society", 60, 309 (1938).

The process for preparing the compound of the invention will now be described.

This process is characterized in that it comprises the following steps:
(a) an aqueous solution of a salt of W (VI) and, where appropriate, of a salt of Mo(VI), is brought into contact with a reducing agent;
(b) the pH of the medium obtained at the end of the preceding step is adjusted to a value of at most 7, as a result of which a suspension is obtained, a cation A being introduced in one of steps (a) or (b);
(c) the suspension obtained at the end of step (b) is subjected to maturing;
(d) the medium obtained at the end of step (c) is heated;
(e) the solid is separated from the medium resulting from the preceding step and is dried, as a result of which a compound $A_xW_{1-y}Mo_yO_3$ for which x>0 is obtained;
(f) optionally, the cation A is eliminated from the compound obtained at the end of step (e), as a result of which the compound $W_{1-y}Mo_yO_3$ is obtained.

The first step of the process of the invention consists in forming a mixture of an aqueous solution of a tungstate salt VI with a reducing agent. This salt may be an alkali metal tungstate such as sodium tungstate.

In the case of the preparation of a compound according to formula (1) wherein y is not zero, the mixture of step (a) also comprises a molybdenum salt which may also be an alkali metal molybdate.

The reducing agent may be selected from hydrazine, sugars such as glucose, and ascorbates, for example sodium ascorbates. The amount of reducing agent introduced is at least double the amount of metal ions (W(VI)+Mo(VI)).

In a second step of the process, step (b), the pH of the medium or of the mixture obtained at the end of the preceding step is adjusted to a value of at most 7. This value may more particularly be at most 2 and it may even more particularly be between 1 and 2. This pH adjustment can be carried out by adding an acid, for example hydrochloric acid.

A cation A must be introduced in one of steps (a) and (b). When A is Li, Na, K or NH$_4$, this cation can be introduced in step (a) by means of the tungsten and/or molybdenum salt, using a salt of this and/or these element(s) and of the cation A, for example potassium tungstate. The cation A, when A is Li, Na, K or NH$_4$, can also be introduced by means of the reducing agent, for example sodium ascorbate, or else by means of a salt containing A when A is H.

The cation A can also be introduced in step (b) of the process by the proton of the acid used to adjust the pH.

The third step of the process is a step of maturing the suspension obtained at the end of the preceding step (b).

Generally, this maturing is carried out at a temperature of at most 80° C. The higher the temperature, the shorter the duration of this maturing.

According to one preferential mode, this maturing is carried out at ambient temperature (20° C.-25° C.), for example over a period of 12 hours.

In the following step of the process, step (d), the medium obtained at the end of the maturing is heated at a temperature of at least 95° C., more particularly of at least 120° C. and even more particularly of at least 200° C., in particular in the case where the reducing agent is selected from sugars. Generally, the lower the heating temperature, the longer the heating time. By way of example, this time may be at least 12 hours for a temperature of 120° C. and at least 3 days for a temperature of 95° C.

This heating is generally carried out under air.

At the end of the heating, the solid is separated from the obtained medium by any known means. This solid is dried under vacuum or under air, optionally after washing.

At the end of the drying, a compound according to the invention in reduced form, i.e. a compound of formula (1) wherein x>0 and therefore a compound comprising the cation A, is obtained.

The preparation process of the invention comprises an additional step for obtaining the compound in stoichiometric form, i.e. a compound of formula (1) wherein x=0 and therefore a compound without cation A.

This additional step, step (f), can be carried out according to different variants.

Step (f) can first of all be heating under air, in particular at a temperature of between 70° C. and 400° C. for at least 2 hours, in the case where A is NH$_4$ or H.

In the case where A is Li, Na, K, NH$_4$ or H, this additional step can consist in subjecting the compound previously obtained to electrochemical oxidation.

This oxidation can be carried out by depositing the compound in reduced form and in powder form on a conductive substrate which acts as an electrode. This electrode is immersed in an electrolyte in which a counter-electrode, for example made of platinum, is also immersed. A potential difference is then applied between the two electrodes in such a way that the potential of the electrode on which the compound has been deposited is greater than 0 V relative to the standard hydrogen electrode.

According to a third variant of this additional step and in the case where A is Li, Na, K or NH$_4$, an ion exchange can then be carried out, in particular by redispersing the compound in reduced form in an acidic aqueous medium at pH≤1, so as to replace Li, Na, K or NH$_4$ with H. The compound then obtained is of formula (1) where A is H. This compound is then treated by one of the methods mentioned above, namely heating under air or electrochemical oxidation.

Examples will now be given.

Example 1

This example relates to the preparation of a compound according to the invention in reduced form and for which A=H and in stoichiometric form.

A mixture of a stable solution of sodium tungstate $Na_2W^{IV}O_4.2H_2O$ (0.15 mol/l) with hydrazine (2.5 equivalents) is formed. The pH is adjusted to 1.3 with hydrochloric acid. A suspension of a white compound is obtained and is maintained at ambient temperature (25° C.) for 12 hours for maturing. The suspension is then heated at 95° C., as a result of which a suspension of a dark blue product is obtained. The heating is maintained at this temperature for 3 days. The solid product is then washed with distilled water by centrifugation and dried. It corresponds to the formula $H_{0.1}WO_3$.

The dried product is then heated for 12 h at 100° C. under air. A compound of formula $WO_3$ is thus obtained.

The two products after drying and after heating exhibit the same X-ray diagram given in FIG. 3. This X-ray diagram demonstrates the structure with the three types of tunnels previously described.

Example 2

The process is carried out as in example 1, but the heating of the suspension is performed at 120° C. for 12 hours. The same products as in example 1 are obtained.

Example 3

The process is carried out as in example 1, but using sodium ascorbate (3 equivalents) as reducing agent. In addition, the heating of the suspension is performed at 220° C. for 12 hours. The same products as in example 1 are obtained.

Example 4

The process is carried out as in example 1, but using glucose (3 equivalents) as reducing agent. The same products as in example 1 are obtained.

Comparative Example 5

The process is carried out as in example 1. However, the suspension obtained after adjustment of the pH is heated directly at 95° C. for 3 days without maturing. After drying, a product of formula $(NH_4)_{0.1}WO_3$ of hexagonal structure, the X-ray diffraction diagram of which at the wavelength Kα of copper is presented in FIG. 4, described in the prior art, the lattice parameters of which are a=7.3(1) and c=3.9(1) and corresponding to a structure having the two types of tunnels (2) and (3) of FIG. 1, is obtained. It is noted that the absence of maturing results in the presence of $NH_4$ in the product obtained.

The invention claimed is:

1. A compound of formula (1) $A_xW_{1-y}Mo_yO_3$ wherein A is selected from the group consisting of the Li, Na, $NH_4$, K and H cations, wherein $0 \leq x \leq 1$ and $0 \leq y \leq 0.5$, and wherein the compound exhibits a crystalline structure of hexagonal type which is based on $WO_6$ octahedra, said structure having tunnels delimited by 6, 4 and 3 of said octahedra and oriented along the axis c.

2. The compound as claimed in claim 1, wherein $0 \leq x \leq 0.2$.

3. The compound as claimed in claim 1, wherein $0.5 \leq x \leq 1$.

4. The compound as claimed in claim 1, wherein x and/or y=0.

5. The compound as claimed in claim 1, wherein the compound exhibits a crystalline structure with lattice parameters a: 10.0(1) Å and c: 3.9(1) Å and space group P6/mmm.

6. The compound as claimed in claim 1, characterized in that it is composed of particles in the shape of platelets of from 50 to 500 nm in diameter and from 2 to 50 nm thick.

7. A process for preparing a compound as claimed in claim 1, the process comprising:
(a) contacting an aqueous solution of a salt of W (VI) and, where appropriate, of a salt of Mo(VI), with a reducing agent to form a first medium;
(b) adjusting the pH of the first medium to a value of at most 7 to form a suspension,
wherein a cation A is introduced in one of steps (a) or (b);
(c) maturing the suspension to form a second medium;
(d) heating the second medium to form a third medium;
(e) separating and drying a solid from the third medium to form a compound $A_xW_{1-y}Mo_yO_3$, wherein x>0;
(f) optionally, eliminating the cation A from the compound $A_xW_{1-y}Mo_yO_3$ to form a compound $W_{1-y}Mo_yO_3$.

8. The process as claimed in claim 7, wherein the aqueous solution in step (a) comprises a salt of tungsten and of the cation A.

9. The process as claimed in claim 7, wherein step (b) comprises adjusting the pH to a value of at most 2.

10. The process as claimed in claim 7, wherein step (c) comprises maturing the suspension at a temperature of at most 80° C.

11. The process as claimed in claim 7, wherein step (d) comprises heating the third medium at a temperature of at least 95° C.

12. The process as claimed in claim 7, wherein the reducing agent is at least one reducing agent selected from hydrazine, sugars and ascorbates.

13. The process as claimed in claim 7, wherein A is $NH_4$ or H and wherein step (f) comprises heating under air.

14. The process as claimed in claim 7, wherein A is Li, Na, K, $NH_4$ or H and wherein step (f) comprises an electrochemical oxidation.

15. The process as claimed in claim 7, wherein A is Li, Na, K or $NH_4$ and wherein step (f) comprises an ion exchange to replace Li, Na, K or $NH_4$ with H followed by heating under air or electrochemical oxidation of the compound resulting from the ion exchange.

16. The process as claimed in claim 9, wherein step (b) comprises adjusting the pH to a value of between 1 and 2.

17. The process as claimed in claim 10, wherein step (c) comprises maturing the suspension at ambient temperature.

18. The process as claimed in claim 11, wherein step (d) comprises heating the third medium at a temperature of at least 120° C.

* * * * *